United States Patent [19]

Eron et al.

[11] Patent Number: 4,786,881
[45] Date of Patent: Nov. 22, 1988

[54] AMPLIFIER WITH INTEGRATED FEEDBACK NETWORK

[75] Inventors: Murat Eron, South Brunswick Township, Middlesex County, N.J.; Henrik F. Ebbesen, Valkenburg, Netherlands

[73] Assignee: General Electric Company, Schenectady, N.Y.

[21] Appl. No.: 89,806

[22] Filed: Aug. 27, 1987

[51] Int. Cl.[4] .............................................. H03F 1/34
[52] U.S. Cl. ..................................... 330/307; 330/277; 330/293; 357/51
[58] Field of Search ............... 330/277, 293, 294, 307; 357/51

[56] References Cited

U.S. PATENT DOCUMENTS

| | | | |
|---|---|---|---|
| 3,289,093 | 11/1966 | Wanlass | 330/35 |
| 3,699,011 | 10/1972 | Nishimura | 204/15 |
| 4,298,846 | 11/1981 | Hirano et al. | 333/32 |

FOREIGN PATENT DOCUMENTS 88774 6/1982 Japan ..................................... 357/51

OTHER PUBLICATIONS

Honjo et al, "Ultrabroadband GaAs Monolithic Amplifier", *Electronic Letters*, vol. 17, No. 24, Nov. 26, 1981, pp. 927-928.

*Primary Examiner*—James B. Mullins
*Attorney, Agent, or Firm*—Henry I. Steckler; James C. Davis, Jr.; Paul R. Webb, II

[57] ABSTRACT

A transistor amplifier has an integral resistance-capacitance negative feedback network in order to stabilize it and allow a broadband impedance match. To minimize transmission line effects and phase shifts, the capacitor is formed using a control electrode pad as one capacitor plate and the control electrode has integral fingers. The resistor can be of the floating gate type for ease of construction. The transistor can be an FET.

9 Claims, 1 Drawing Sheet

AMPLIFIER WITH INTEGRATED FEEDBACK NETWORK

BACKGROUND OF THE INVENTION

The present invention relates to an amplifier with an integrated resistance-capacitance feedback network, and more particularly to such an amplifier having a field effect transistor (FET) for use at microwave frequencies.

FETs, especially those having high power capability, have a low input impedance at microwave frequencies, such as X or K bands, due to their gate input capacitance and can be unstable at certain combinations of source and load impedances, thereby making a broadband impedance match difficult to achieve. In order to reduce these problems negative feedback around the FET is used. When the feedback is implemented in hybrid circuit form, bond wires are used, which form is expensive due to the labor involved, does not result in repeatable characteristics, is mechanically unreliable, occupies a large area, and has parasitic inductances and couplings. Further, the feedback network exhibits transmission line effects, which result in unstable operation at high frequencies where the feedback signal can have undesirable phase shifts. Also, phase shifts can occur in the gate pad between different sections of a high power FET, so the output voltages from the sections do not add in phase; this reduces power output as compared to the situation when all sections add in phase. The feedback network and FET have been combined in a prior art monolithic circuit construction, in which all external connections except for input and output leads are eliminated. The input and output leads are on opposite sides of the integrated circuit package, and the feedback network has been connected between the input and output leads using metallization runs. This results in a more reliable circuit, and reduces the occupied space and cost. While the transmission line effect, phase shift effect, and parasitic couplings and inductance are reduced they are not eliminated using these construction procedures, however, the inventors observed. Accordingly the inventors sought a monolithic circuit construction avoiding metallization runs that tend to cause these undesirable effects at high frequencies.

SUMMARY OF THE INVENTION

An amplifier comprises a transistor having a control electrode including a pad, a grounded common electrode, and at least one output electrode, a capacitor comprising said control electrode pad as a first plate, a dielectric overlying said control electrode pad, and a second plate overlying said dielectric, and at least one resistor connecting said output electrode and said second plate.

DETAILED DESCRIPTION OF THE PREFERRED EMBODIMENT

Figure 1:
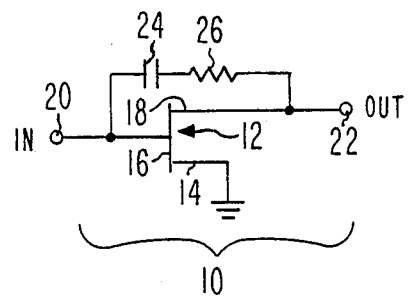
FIG. 1 is a circuit diagram of the invention.

In FIG. 1 is shown an amplifier 10 comprising an N-channel depletion mode FET 12 having a grounded common electrode, such as a source 14; a control electrode, such as a gate 16; and an output electrode, such as a drain 18. The gate 16 receives an unbalanced input signal from a terminal 20, as well as a negative bias voltage with respect to the source 14 from a first D.C. supply (not shown). An unbalanced amplified output signal is provided by the drain 18 to an output terminal 22, which output terminal 22 receives a positive voltage with respect to the source 14 from a second D.C. supply (not shown). Further, impedance matching networks (not shown) are normally coupled to the terminals 20 and 22, respectively. In order to stabilize the amplifier 10 and to allow broadband impedance matching, a negative feedback network comprising a series connection of a D.C. blocking capacitor 24 and a resistor 26, typically 100 to 1000 ohms, connects between the drain 18 and the gate 16.

Figure 2:
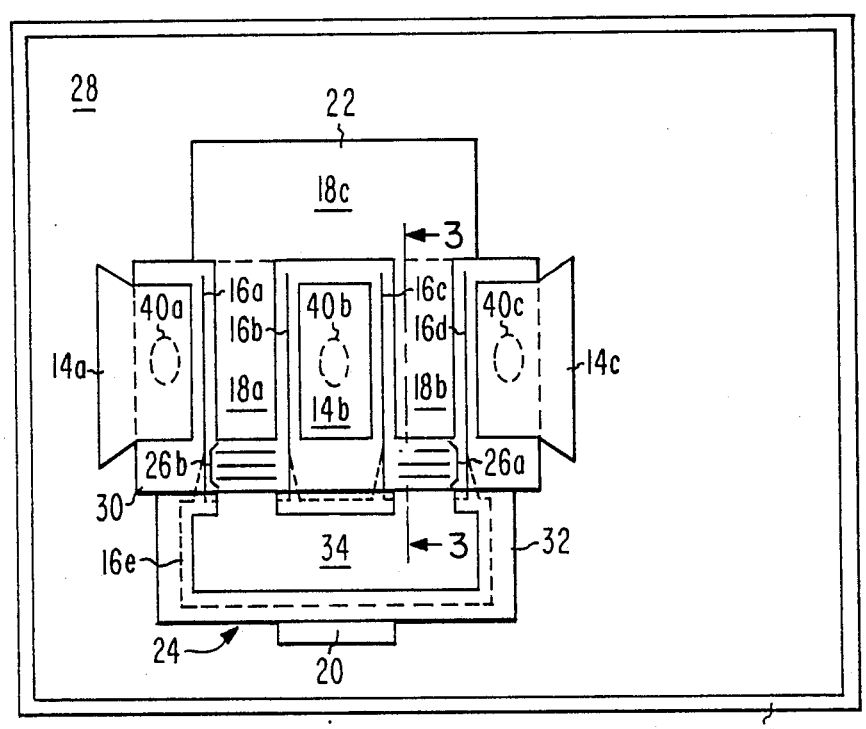
FIG. 2 is a plan view of the invention.

As shown in FIG. 2, a conducting ground plane 27 has an overlying semi-insulating substrate 28, such as GaAs, InP, GaInAs, undoped Si or Ge, etc., which in turn has an overlying conducting mesa 30 of about 1000 $\mu$m thickness. Mesa 30 can be of the same material type as the substrate 28 but doped with an N-conductivity type dopant such as Si, P, As, Sb, Te, S, etc. The ground plane 27 is not necessary for electrical operation, but is useful to bond the amplifier 10 to a carrier (not shown) and for heat dissipation. The source electrode 14 comprises a plurality of conducting layers 14a, 14b, and 14c overlying the mesa 30, with portions of the layers 14a and 14c also overlying the substrate 28. The layers 14a, 14b, and 14c are connected to the ground plane 27 by means of vias 40a, 40i b, 40c, respectively, or by means of air bridges (not shown) to a ground pad (not shown), if the ground plane 27 is not present, or by a combination of air bridges and vias. Similarly, the drain electrode 18 comprises a plurality of conducting fingers 18a and 18b and an integral conducting drain pad 18c. Fingers 18a and 18b overlie the mesa 30. Finger 18a is disposed between the conducting layers 14a and 14b; finger 18b is disposed between the conducting layers 14b and 14c. The pad 18c overlies the substrate 28 and has a portion comprising the output terminal 22. The gate electrode 16 comprises a plurality of conducting gate fingers 16a, 16b, 16c and 16d and an integral conducting gate pad 16e. The fingers 16a to 16d overlie the mesa 30. The finger 16a is disposed between the layer 14a and the finger 18a; the finger 16b is disposed between the finger 18a and the layer 14b; the finger 16c is disposed between the layer 14b and the finger 18b; the finger 16d is disposed between the finger 18b and the layer 14c. The pad 16e overlies the substrate 28 and has the input terminal 20. The gate fingers 16a to 16d are shown as lines since their width in the source-to-drain direction is very small, e.g., less than 1 micron ($\mu$m), typically 0.1 to 0.5 $\mu$m. Thus the FET 12 comprises a plurality, four in the illustrated embodiment, of parallel connected sections, each section centered on a respective gate finger 16a to 16d.

Overlying the gate pad 16e is a thin dielectric 32, such as $SiO_2$ or $Si_3N_4$, having a thickness of about 200 nm, while overlying the dielectric 32 is a conducting layer 34. The gate pad 16e, the dielectric 32, and the layer 34 comprise the capacitor 24 with the gate pad 16e and the layer 34 comprising first and second plates thereof, respectively. If GaAs is used for the mesa 30, source 14 and the drain 18 preferably can comprise Au/Ge/Ni alloyed ohmic contacts, while Al, Ti, etc., is used for the Schottky barrier gate 16. The conducting layer 34 and the ground plane 27 can be Ti/Pt/Au layers. The resistor 26 comprises parallel connected floating gate resistor sections 26a and 26b.

Figure 3:
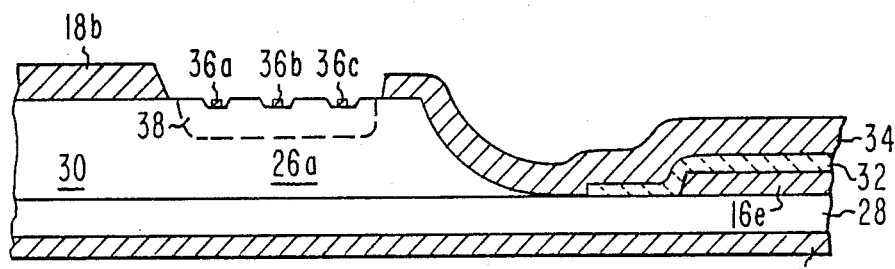
FIG. 3 is a cross-sectional view taken along the lines 3—3' of FIG. 2.

As best seen in FIG. 3, the resistor section 26a (and thus the identical resistor section 26b) comprises a plurality of conducting metal strips 36a, 36b, and 36c, such as Ti, Al, etc., that form a Schottky barrier with the mesa 30. In the particular embodiment, three strips were used to obtain the proper value of resistance and avoid current saturation. In turn, this creates a depletion zone 38 in the mesa 30. Thus current flowing between the layer 34 and the drain finger 18b must pass under the depletion zone 38 and above the semi-insulating substrate 28. The length, width, and depth of the zone 38, the thickness of the mesa 30, and the number of the strips 36 determine the resistance value of the resistor section 26a thereby created.

Alternatively, in another embodiment of the invention, the resistor section 26a and 26b can comprise a thin film of resistive material deposited between the drain finger 18b and the layer 34 and directly overlying the substrate 28 with the mesa 30 ending at the edge of the finger 18b. However, floating gate resistors are easier to fabricate since the strips 36 can be deposited and defined at the same time as the gate 16, avoiding the need for the extra processing steps associated with the thin film resistor.

The fact that the gate 16 and the drain 18 are on the same side of the FET chip, the use of the gate pad 16e as a capacitor plate, and the integral construction of the gate pad 16e and the gate fingers 16a, 16b, 16c, and 16d reduces the area the feedback network takes up on the monolithic circuit. This is in addition to reducing transmission line effects, parasitic couplings, and phase shifts, resulting in a higher frequency of operation, inherent unconditional stability and greater power output especially at millimeter wave frequencies, i.e., above 30 GHz. Further, no special processing steps are required and complexity is not increased.

It will be also appreciated that the invention can be used with a bipolar transistor. In this case the control electrode 14 comprises a base electrode, the common electrode 14 comprises an emitter electrode, and the output electrode 18 comprises a collector electrode.

What is claimed is:

1. An amplifier comprising:
    a semi-insulating substrate;
    a conducting mesa overlying said substrate;
    a transistor disposed on said substrate and having a control electrode including a pad, a grounded common electrode and at least one output electrode;
    a capacitor comprising said control electrode pad as a first plate, a dielectric overlying said control electrode pad, and a second plate overlying said dielectric; and
    at least one floating gate resistor connecting said output electrode and said second plate and comprising at least one conducting strip disposed on said mesa and forming a Schottky barrier therewith.

2. The amplifier of claim 1 wherein said control electrode further comprises at least one finger integral with said control electrode pad.

3. The amplifier of claim 2 wherein said control electrode further comprises a plurality of control fingers integral with said control electrode pad.

4. The amplifier of claim 1 wherein said resistor comprises a pair of floating gate resistors.

5. The amplifier of claim 1 wherein said transistor comprises a field effect transistor.

6. The amplifier of claim 1 wherein said common electrode comprises a plurality of conducting pads.

7. The amplifier of claim 1 wherein said output electrode comprises a plurality of conducting fingers and a conducting pad integral therewith.

8. The amplifier of claim 1 further comprising a ground plane underlying said substrate.

9. The amplifier of claim 1 wherein said resistor has a value such that the amplifier is unconditionally stable.

* * * * *